United States Patent
Chen et al.

(10) Patent No.: US 11,776,850 B2
(45) Date of Patent: *Oct. 3, 2023

(54) SEMICONDUCTOR DEVICE WITH REDUCED LOADING EFFECT

(71) Applicant: Taiwan Semiconductor Manufacturing Co., Ltd., Hsinchu (TW)

(72) Inventors: Wei-Lun Chen, Taipei (TW); Li-Te Lin, Hsinchu (TW); Chao-Hsien Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/652,761

(22) Filed: Feb. 28, 2022

(65) Prior Publication Data

US 2022/0181212 A1    Jun. 9, 2022

Related U.S. Application Data

(63) Continuation of application No. 16/924,686, filed on Jul. 9, 2020, now Pat. No. 11,264,281.

(51) Int. Cl.
*H01L 21/8234*    (2006.01)
*H01L 21/3065*    (2006.01)
(Continued)

(52) U.S. Cl.
CPC .... *H01L 21/823412* (2013.01); *H01L 21/308* (2013.01); *H01L 21/3065* (2013.01);
(Continued)

(58) Field of Classification Search
CPC ............... H01L 21/3065; H01L 21/308; H01L 21/31144; H01L 21/823412;
(Continued)

(56) References Cited

U.S. PATENT DOCUMENTS

| | | | |
|---|---|---|---|
| 2008/0124931 A1* | 5/2008 | Lee | ..................... H01L 21/0332 438/692 |
| 2008/0220611 A1 | 9/2008 | Jeon | |
| 2019/0157095 A1 | 5/2019 | Zhou et al. | |

FOREIGN PATENT DOCUMENTS

WO    WO 2015/099691 A1    7/2015

OTHER PUBLICATIONS

European Search Report directed to related Application No. 21184490.7, dated Nov. 23, 2021, 1 page.

* cited by examiner

*Primary Examiner* — Cheung Lee
(74) *Attorney, Agent, or Firm* — Sterne, Kessler, Goldstein & Fox P.L.L.C.

(57) ABSTRACT

The present disclosure relates to a method for forming a semiconductor structure includes depositing a dielectric layer on a substrate and depositing a patterning layer on the dielectric layer. The method also includes performing a first etching process on the patterning layer to form a first region including a first plurality of blocks at a first pattern density and a second region including a second plurality of blocks at a second pattern density that is lower than the first pattern density. The method also includes performing a second etching process on the second plurality of blocks to decrease a width of each block of the second plurality of blocks and etching the dielectric layer and the substrate using the first and second pluralities of blocks to form a plurality of fin structures.

20 Claims, 7 Drawing Sheets

(51) Int. Cl.
   *H01L 21/308* (2006.01)
   *H01L 27/088* (2006.01)
   *H01L 29/06* (2006.01)
   *H01L 29/10* (2006.01)
   *H01L 21/311* (2006.01)
   *H01L 21/8238* (2006.01)
   *H01L 27/092* (2006.01)
   *H01L 29/66* (2006.01)
   *H01L 29/78* (2006.01)

(52) U.S. Cl.
   CPC .... *H01L 21/3086* (2013.01); *H01L 21/31116* (2013.01); *H01L 21/31144* (2013.01); *H01L 21/823431* (2013.01); *H01L 21/823807* (2013.01); *H01L 27/0886* (2013.01); *H01L 27/0924* (2013.01); *H01L 29/0657* (2013.01); *H01L 29/0692* (2013.01); *H01L 29/1025* (2013.01); *H01L 29/1037* (2013.01); *H01L 29/66795* (2013.01); *H01L 29/785* (2013.01)

(58) Field of Classification Search
   CPC ..... H01L 21/823431; H01L 21/823807; H01L 27/0886; H01L 27/0924; H01L 29/0657; H01L 29/0684; H01L 29/0692; H01L 29/1025; H01L 29/1037; H01L 29/66795; H01L 29/785; B82Y 10/00; B82Y 40/00
   See application file for complete search history.

SEMICONDUCTOR DEVICE WITH REDUCED LOADING EFFECT

This application is a continuation of U.S. Non-provisional patent application Ser. No. 16/924,686, titled "Semiconductor Device with Reduced Loading Effect," which was filed on Jul. 9, 2020 and issuing as U.S. Pat. No. 11,264,281 on Mar. 1, 2022, which is incorporated herein by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. This scaling process provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
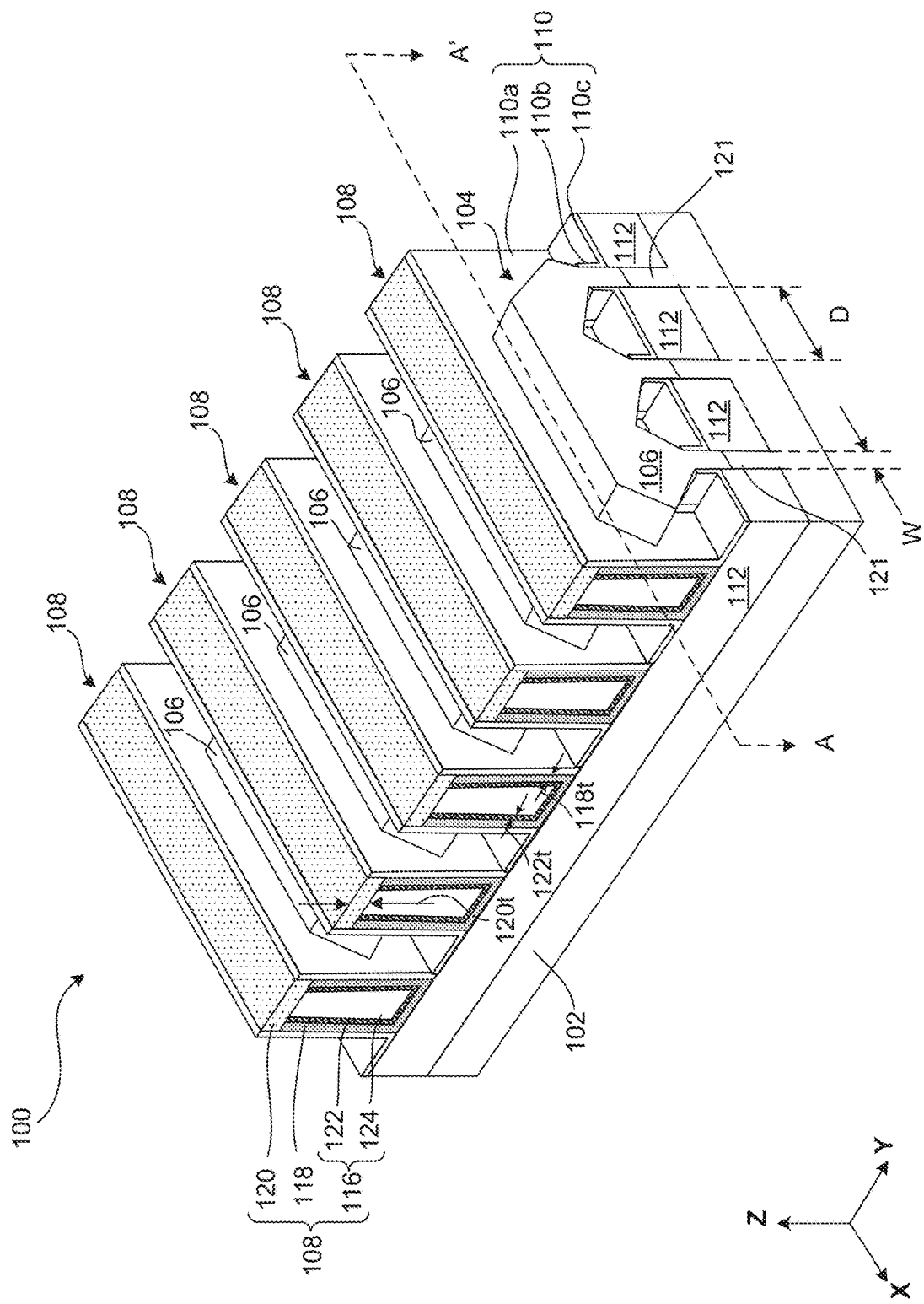
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of a target value (e.g., ±1%, ±2%, ±3%, ±4%, ±5% of the target value).

As technologies progress, integrated circuits (ICs) are characterized by decreasing dimension requirements over previous generation devices. As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like structure (e.g., fin) extending from the substrate. The widths of the fin structures are often designed to be equal to a critical dimension of the lithography apparatus that is used for forming the transistors. The critical dimension can be about 7 nm, about 5 nm, about 3 nm, or any suitable dimensions. Source, drain, and channels of the transistor is formed on the fin. FinFETs are compatible with conventional complementary metal-oxide-semiconductor (CMOS) processes and their three-dimensional structure allows them to be aggressively scaled while maintaining gate control and mitigating short channel effects.

There are challenges to implement such features and processes. As fin size and spacing between fins decrease, the loading effect can be exacerbated across devices on the same wafer or die. For example, fins that are designed to have substantially the same width can result in different fin widths due to etching variations in regions of different pattern density. The loading effect can be derived from etching rate variances across a semiconductor device due to different patterning (e.g., pattern density, aspect ratio of features, and/or composition/reflectivity of features). For example, due to the physical and chemical nature of a plasma etching process, regions with high pattern density can have lower etch rate but higher plasma scattering, while patterns with low density can have a greater etch rate but lower plasma scattering. Therefore, the variations in the behavior of plasma etchants can result in different profiles after the plasma etch, resulting in loading across different patterns.

Various embodiments in accordance with this disclosure provide methods of forming fin structures having uniform lateral dimensions in areas of different pattern density. Fin structures can be formed by forming one or more patterned patterning layers on a substrate followed by a plasma etching process. An etch-adjusting layer can be deposited between the substrate and the one or more patterned patterning layers. The one or more patterned patterning layers can include one or more hard mask layers. During one or more stages of the plasma etching process, the etch-adjusting layer can retard downward etching progress and enhance lateral etching progress to achieve substantially the same etching profiles in isolated regions (e.g., regions with lower pattern density) and dense regions (e.g., regions with higher pattern density). In some embodiments, precursors for the plasma etching process can be selected based on their mobility in isolated regions and dense regions. For example, precursors with higher mobility in isolated regions and lower mobility in dense regions can be selected for one or more stages of the plasma etching process.

Figure 5:
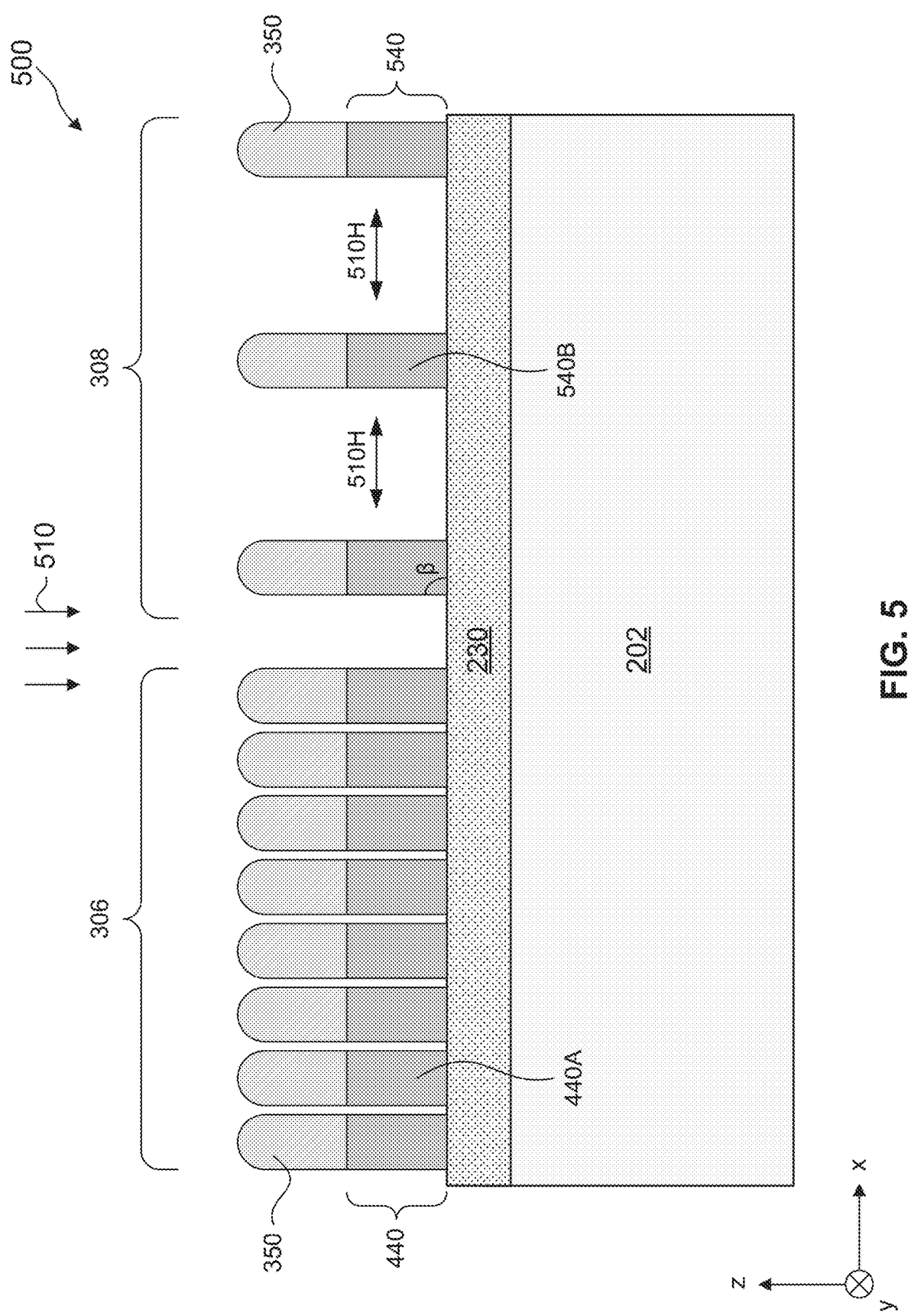
Figure 6:
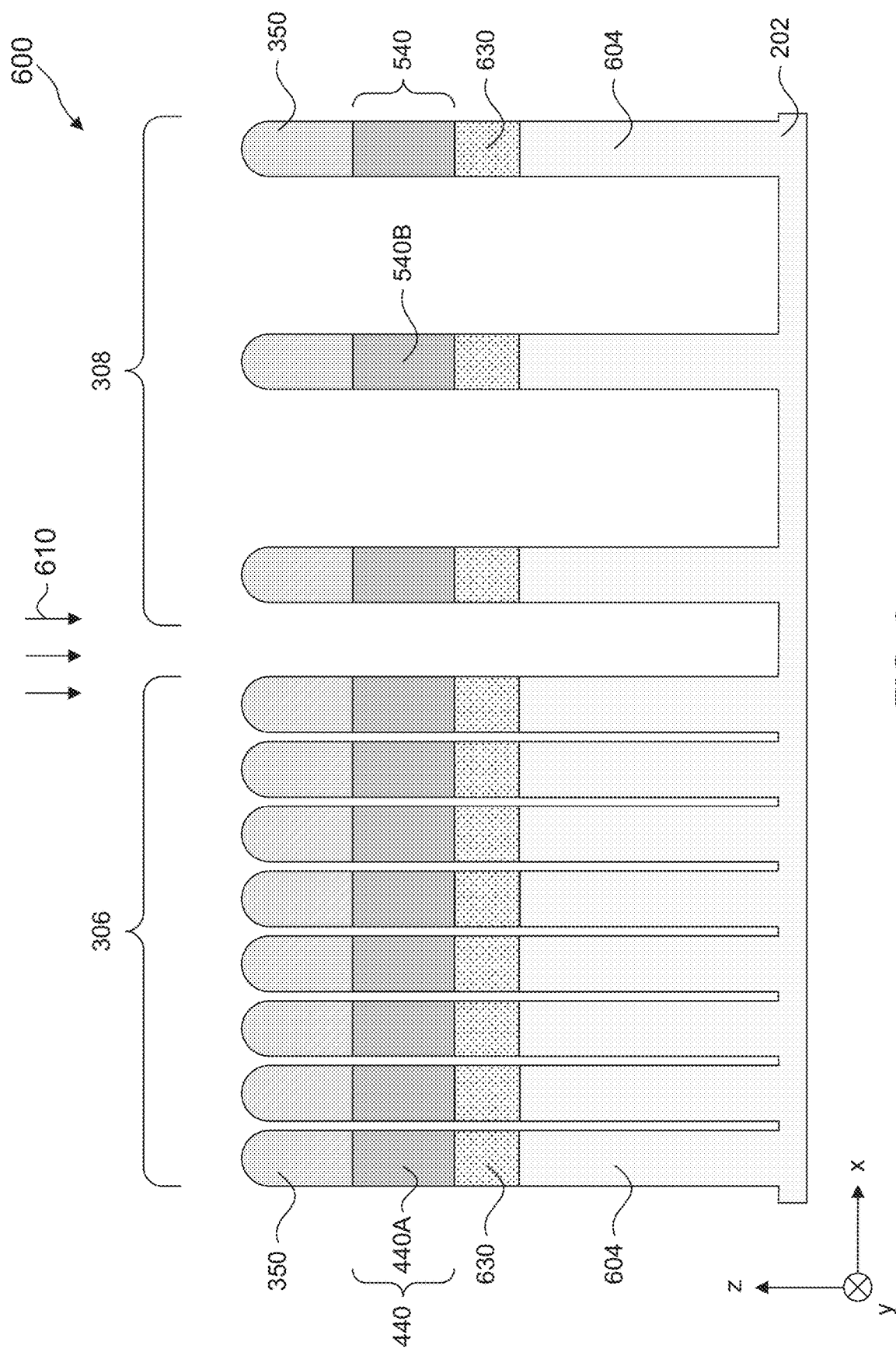
Figure 7:
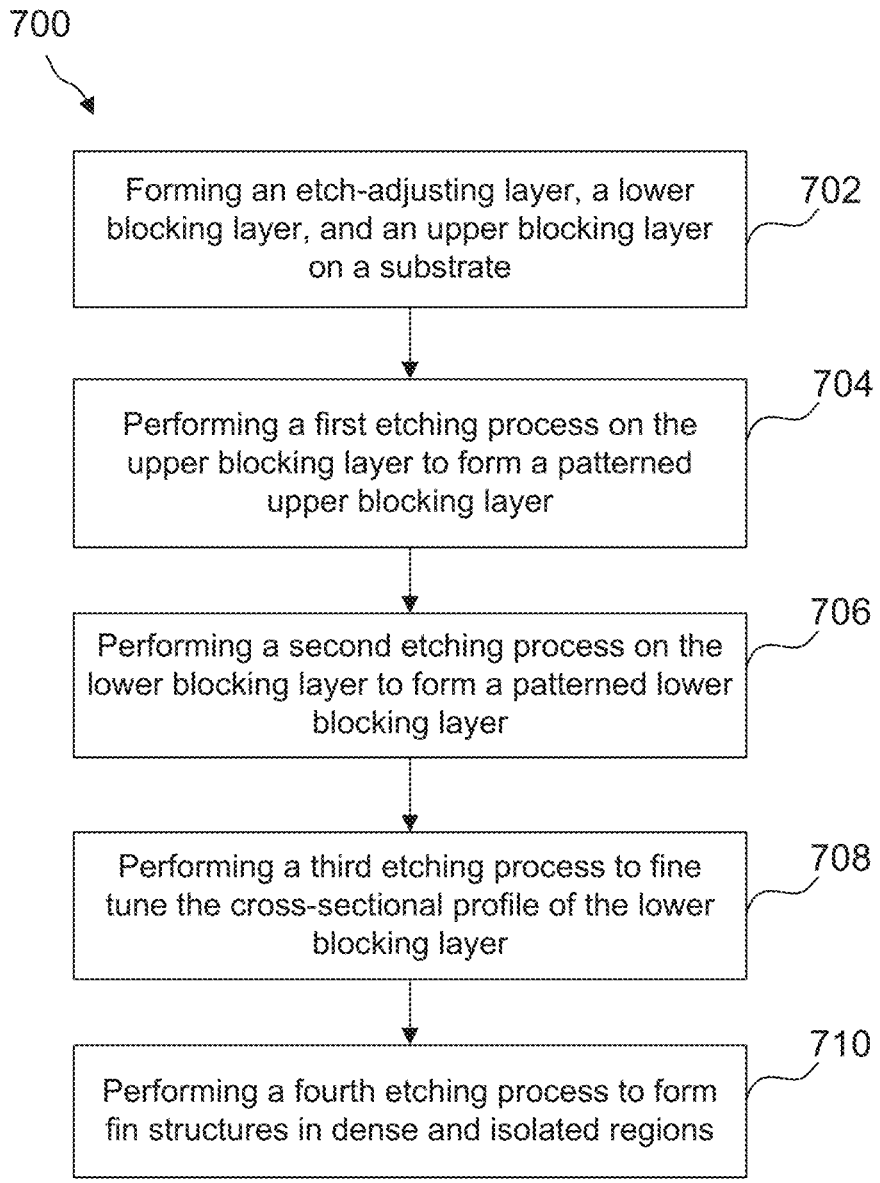
FIG. 7 is a flow diagram of a method of forming fin structures with different pattern density and substantially the same width, in accordance with some embodiments.

FIG. 1 is an isometric view of a finFET. FIGS. 2-6 illustrate a semiconductor device during various fabrication stages for forming fin structures having substantially the same cross-sectional profile in isolated and dense regions. FIG. 7 is an exemplary flow diagram illustrating a method for forming a plurality of fin structures in isolated and dense regions.

FIG. 1 is an isometric view of a finFET, according to some embodiments. FinFET 100 can be included in a microprocessor, memory cell, or other integrated circuit. The view of finFET 100 in FIG. 1 is shown for illustration purposes and may not be drawn to scale. FinFET 100 may include further suitable structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows three fin structures 104 and five gate structures 108. Based on the disclosure herein, finFET 100 can have more or fewer fin structures or gate structures. In addition, finFET 100 can be incorporated into an integrated circuit through the use of other structural components—such as S/D contact structures, gate contact structures, conductive vias, conductive lines, dielectric layers, and passivation layers—that are omitted for the sake of clarity.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, semiconductor structure 100 can also include a processed integrated circuit wafer embedded in substrate 102. For example, substrate 102 can include logic, analog, RF (radio-frequency) components made out of a variety of transistors, capacitors, resistors and interconnections and are not shown in FIG. 1 for simplicity.

Fin structures 104 represents current-carrying structures of finFET 100 and can traverse along a Y-axis and through gate structures 108. Each fin structure of fin structures 104 can have a width W that substantially equals to or greater than a critical dimension of the lithography apparatus used to manufacture finFET 100. For example, width W can be about 3 nm, about 5 nm, about 7 nm, or any suitable dimension. Fin structures of fin structures 104 can be separated by a distance D that can vary across the wafer or die. For example, fin separations in isolated regions can be greater than fin separations in dense regions. In some embodiments, distance D can be between about 20 nm and about 70 nm in isolated regions and between about 10 nm and about 20 nm in dense regions. For example, in isolated regions, distance D can be between about 20 nm and about 30 nm, between about 30 nm and about 50 nm, between about 50 nm and about 70 nm, or any suitable distances. In some embodiments, in dense regions, distance D can be between about 10 nm and about 15 nm, between about 15 nm and about 20 nm, or any suitable distances. In some embodiments, a ratio of W/D can be between about 0.1 and about 0.5 in isolated regions and between about 1 and about 2 in dense regions. In some embodiments, distance D can vary within an isolated region or a dense region. Fin structures 104 can include: (i) portions of fin regions 121 underlying gate structures 108; and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by corresponding one of gate structures 108. Fin regions 121 on opposing sides of gate structures 108 can be etched back such that S/D regions 106 can be epitaxially grown on the etched back portions of fin regions 121.

Fin regions 121 of fin structure 104 can include material similar to substrate 102. S/D regions 106 can include an epitaxially grown semiconductor material. In some embodiments, the epitaxially grown semiconductor material is the same material as substrate 102. In some embodiments, the epitaxially grown semiconductor material includes a different material from substrate 102. The epitaxially grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. Other materials for fin structure 104 are within the scope of this disclosure.

In some embodiments, S/D regions 106 can be grown by (i) chemical vapor deposition (CVD), such as by low pressure CVD (LPCVD), ultrahigh vacuum CVD (UHVCVD), reduced pressure CVD (RPCVD), or a suitable CVD process; (ii) molecular beam epitaxy (MBE) processes; (iii) a suitable epitaxial process; and (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be p-type regions or n-type regions. In some embodiments, p-type S/D regions 106 can include SiGe and can be in-situ doped during epitaxial growth using p-type dopants, such as boron, indium, and gallium. For p-type in-situ doping, p-type doping precursors, such as diborane ($B_2H_6$), boron trifluoride ($BF_3$), and other p-type doping precursors, can be used. In some embodiments, n-type S/D regions 106 can include Si and can be in-situ doped during an epitaxial growth process using n-type dopants, such as phosphorus and arsenic. For n-type in-situ doping, n-type doping precursors, such as phosphine ($PH_3$), arsine ($AsH_3$), and other n-type doping precursors, can be used. In some embodiments, S/D regions 106 are not in-situ doped, and an ion implantation process is performed to dope S/D regions 106.

Spacer 110 can include spacer portions 110a that form on sidewalls of gate structure 108 and are in contact with dielectric layer 118, spacer portions 110b that form on sidewalls of fin structure 104, and spacer portions 110c that form as protective layers on STI regions 106. Each spacer portion can also be a multi-spacer structure including more than one spacer structure. For example, spacer portion 110a can include more than one spacer and an air gap formed between gate structure 108 and fin structure 104. A seal material can be formed over the air gap to enclose and protect the air gap from subsequent fabrication processes. The air gap and seal material are not shown in FIG. 1 for simplicity. Spacers 110 can include insulating material, such as silicon oxide, silicon nitride, a low-k material, and a combination thereof. Spacers 110 can include a low-k material with a dielectric constant less than 3.9 (e.g., less than 3.5, 3, and 2.8). As air gaps can have dielectric constant about 1, the effective dielectric constant of spacers 110 can be further reduced compared to spacers formed using only low-k material. The low-k material for spacers 110 can be formed using suitable deposition processes, such as an atomic layer deposition (ALD). In some embodiments, spacers 110 can be deposited using CVD, LPCVD, UHVCVD, RPCVD, physical vapor deposition (PVD), any other suitable deposition processes, and combinations thereof. In some embodiments, the seal material can be a highly rigid material such as HRSCO. In some embodiments, the seal material can be a bilayer seal material formed by depositing a first seal material on top portions of an opening formed between gate structures 108 and S/D regions 106, followed by a deposition of second seal material on the first seal material to form an enclosure having air trapped in the opening. Other materials and thicknesses for spacers 110 and seal material are within the scope of this disclosure.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having dielectric constant greater than about 3.9). Dielectric layer 118 can be formed by CVD, atomic layer deposition (ALD), physical vapor deposition (PVD), e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 have a thickness 118t in a range of about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 can be formed by ALD, PVD, CVD, or other suitable deposition processes. Other materials and formation methods for gate metal fill layer 124 are within the scope of this disclosure.

In some embodiments, gate capping layer 120 can have a thickness 120t in a range from about 5 nm to about 50 nm and can protect gate structure 108 during subsequent processing of finFET 100. Gate capping layer 120 can include nitride material, such as silicon nitride, silicon-rich nitride, and silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and other suitable insulating materials. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

FIG. 7 illustrates a fabrication process that forms fin structures of a semiconductor device with substantially equal widths throughout different regions of a semiconductor substrate (e.g., isolated and dense regions of the semiconductor substrate). FIGS. 2-6 provide various views of the semiconductor device during the fabrication process described with reference to FIG. 7. The fabrication process can incorporate an etch-adjusting layer between one or more patterning layers and the substrate. The fabrication processes provided herein are exemplary, and alternative processes in accordance with this disclosure may be performed that are not shown in these figures. The fabrication process and semiconductor device described in FIGS. 2-6 are for illustration purposes only. For example, the fabrication process described in FIG. 6 can be used to form any suitable three-dimensional transistors, such as finFETs or gate-all-around (GAA) devices. In some embodiments, the fabrication process can be used to form any suitable semiconductor devices that include a plurality of protruding structures with different pattern densities.

Figure 2:
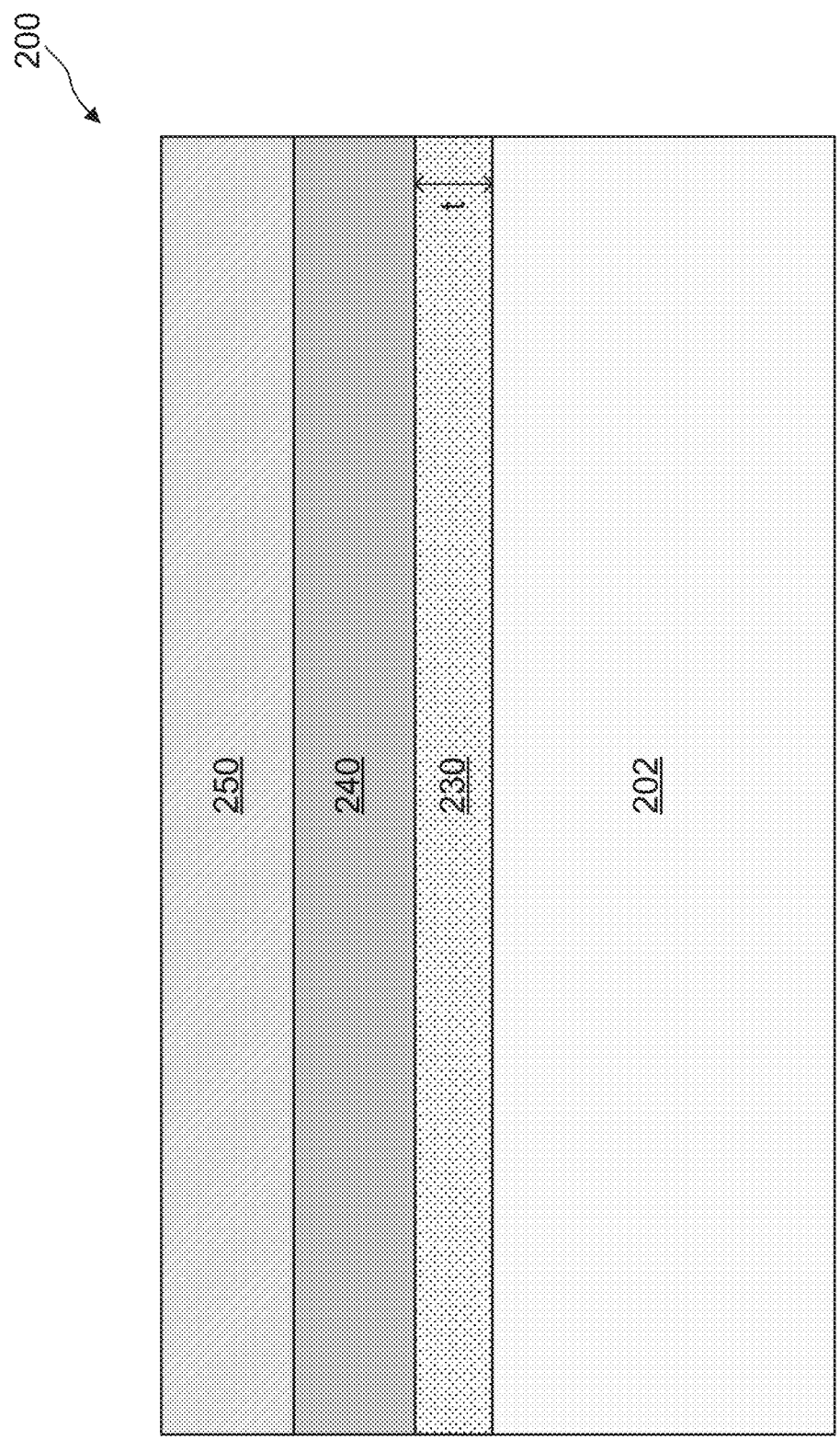
FIGS. 2-6 are cross-sectional views of various fabrication stages of a semiconductor structure to form fin structures with different pattern density, in accordance with some embodiments.

Referring to FIG. 7, in operation 702, an etch-adjusting layer, a lower patterning layer, and an upper patterning layer is formed on a substrate, according to some embodiments. FIG. 2 is a cross-sectional view of semiconductor structure 200, after an etch-adjusting layer 230, a lower patterning layer 240, and an upper patterning layer 250 are disposed on substrate 202.

Semiconductor structure 200 includes a substrate 202. In some embodiments, substrate 202 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 202 can be a semiconductor on insulator (SOI). In some embodiments, substrate 202 can be an epitaxial material. In some embodiments, substrate 202 can be similar to substrate 102 described above in FIG. 1.

In some embodiments, etch-adjusting layer 230 is formed on substrate 202 and can be used to prevent the etching of substrate 202 during the formation of a patterned patterning layer. Etch-adjusting layer 230 can be formed using a dielectric material, such as silicon oxide, silicon nitride, silicon oxynitride, silicon carbon nitride, any suitable dielectric material, and/or combinations thereof. In some embodiments, etch-adjusting layer 230 can be formed by one or more layers of material. For example, etch-adjusting layer 230 can be formed by first, second, and third sublayers, formed using silicon oxide, silicon nitride, and silicon oxynitride, respectively. In some embodiments, etch-adjusting layer 230 can be formed using a low-k dielectric material (e.g., dielectric material having a dielectric constant lower than about 3.9). In some embodiments, etch-adjusting layer 230 can be formed using metal oxide material, such as hafnium oxide, zirconium oxide, any suitable metal oxide material, and/or combinations thereof. In some embodiments, etch-adjusting layer 230 can be formed using material that is suitable for an etch stop layer. The deposition of etch-adjusting layer 230 can be done by any suitable processes, such as chemical vapor deposition (CVD), physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, any suitable deposition method, and/or combinations thereof. In some embodiments, a thickness t of etch-adjusting layer can be between about 3 nm and about 5 nm. In some embodiments, thickness t of etch-adjusting layer can be greater than about 5 nm. For example, thickness t can be between about 3 nm and about 4 nm, between 4 nm and about 5 nm, between 5 nm and about 7 nm, between about 7 nm and about 10 nm, between about 10 nm and about 15 nm, or any suitable thickness. In some embodiments, reducing thickness t of etch-adjusting layer 230 below about 3 nm can cause a reduction in the durability of etch-adjusting layer 230 during subsequent etching processes. In some embodiments, increasing the thickness t of etch-adjusting layer 230 over 5 nm can prolong the etching process and damage one or more patterned patterning layers that are formed on etch-adjusting layer 230.

Lower patterning layer 240 is disposed on a top surface of etch-adjusting layer 230 and can be made of a dielectric material. For example, lower patterning layer 240 can be formed of silicon oxide, spin-on-glass, silicon nitride, silicon oxynitride, fluorine-doped silicate glass (FSG), a low-k dielectric material, and/or other suitable insulating material. In some embodiments, the thickness of lower patterning layer 240 can be between about 3 nm and about 8 nm. For example, thickness of lower patterning layer 240 can be between about 3 nm and about 5 nm, between about 5 nm and about 8 nm, or any suitable thickness. Increasing the thickness of lower patterning layer 240 can provide greater protection of the underlying substrate during the etching processes that forms the fins. The deposition of lower patterning layer 240 can be done by any suitable process, such as CVD, PVD, ALD, MBE, HDPCVD, MOCVD, RPCVD, PECVD, other suitable methods, and/or combinations thereof.

Upper patterning layer 250 is disposed on a top surface of lower patterning layer 240 and can be made of a dielectric material or a photoresist material. For example, upper patterning layer 250 can be formed of silicon oxide, spin-on-glass, silicon nitride, silicon oxynitride, FSG, a low-k dielectric material, and/or any other suitable insulating material. In some embodiments, upper patterning layer 250 and lower patterning layer 240 are formed using different material. For example, upper patterning layer 250 can be formed of a photoresist material and lower patterning layer 240 can be formed of silicon oxide.

Figure 3:
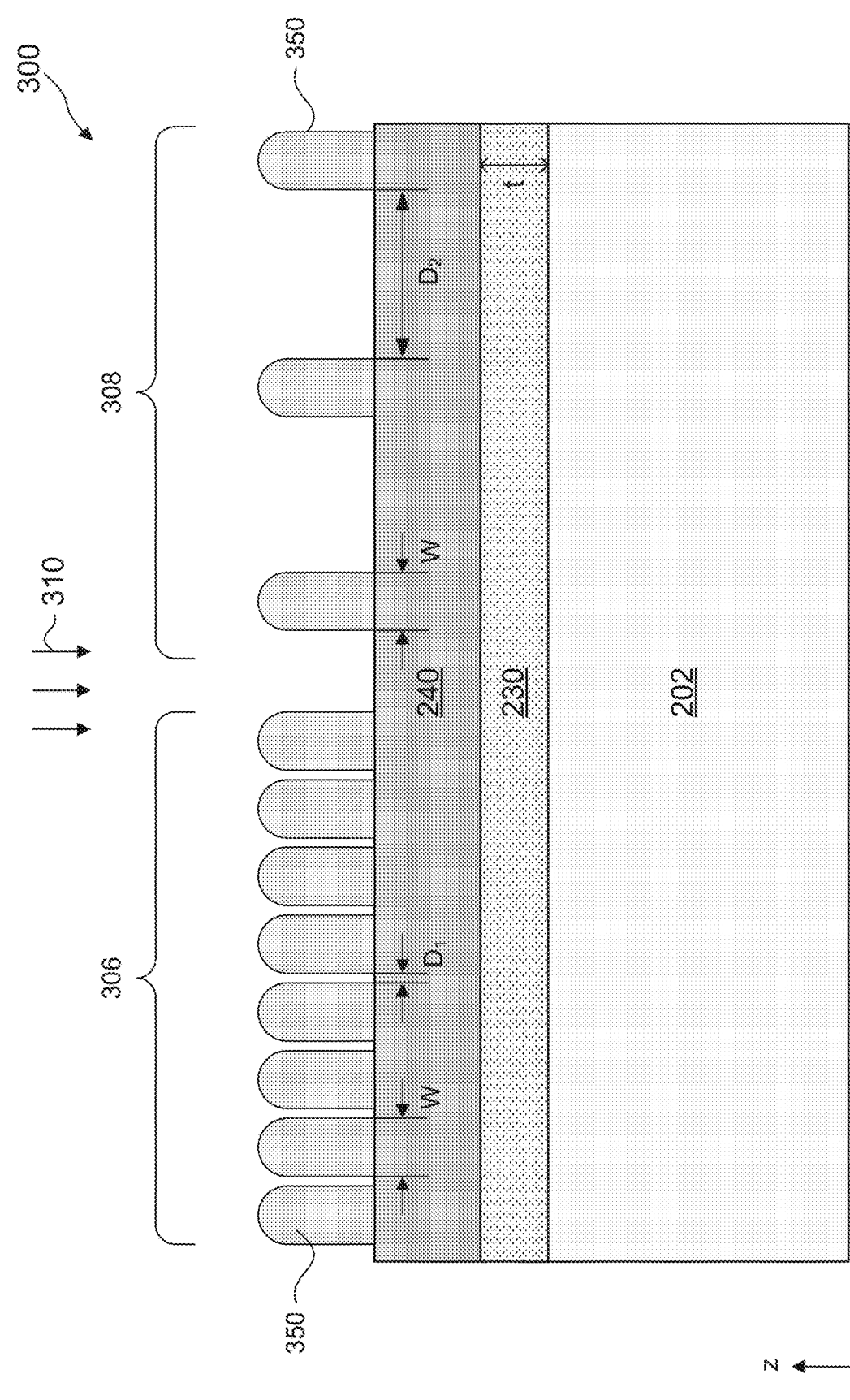

Referring to FIG. 7, in operation 704, a first etching process is performed on the upper patterning layer to form a patterned upper patterning layer, according to some embodiments. FIG. 3 is a cross-sectional view of semiconductor structure 300, after a patterned upper patterning layer 350 is formed. Patterned upper patterning layer 350 is formed by patterning upper patterning layer 250 of FIG. 2. Patterned upper patterning layer 350 can include a plurality of blocks formed on a top surface of lower patterning layer 240.

In some embodiments, upper patterning layer 250 can be formed using a dielectric material. A first etching process 310 of upper patterning layer 250 can include depositing a photoresist material on the dielectric material, exposing and patterning the photoresist to expose the portions of the dielectric material, and etching the exposed portions of the dielectric material. In some embodiments, first etching process 310 can be a plasma etching process or a wet chemical etching process.

In some embodiments, upper patterning layer 250 can be formed using a photoresist material. First etching process 310 of upper patterning layer 250 can include exposing the photoresist material to a pattern on a reticle, performing a post-exposure baking process, and developing the exposed photoresist material in a solution.

Patterned upper patterning layer 350 can have different pattern densities across substrate 202. For example, patterned upper patterning layer can include a dense region 306 (e.g., regions with greater pattern density) and an isolated region 308 (e.g., regions with lower pattern density). In some embodiments, each block of patterned upper patterning layer 350 can have a width W that is substantially equal to or greater than a critical dimension of a photolithography apparatus used for patterning upper patterning layer 250. For example, width W can be about 3 nm, about 5 nm, about 7 nm, or any other suitable dimension. In dense region 306, each block of patterned upper patterning layer 350 can be separated by a uniform distance $D_1$. In some embodiments, distance $D_1$ can vary within dense region 306. In some embodiments, distance $D_1$ can be between about 5 nm and about 20 nm. For example, distance $D_1$ can be between about 5 nm and about 7 nm, between about 7 nm about 14 nm, or between about 14 nm and about 20 nm. For example, distance $D_1$ can be about 15 nm. In some embodiments, dense region 306 can be a region of substrate 202 where one or more features are separated from each other by a minimum design rule spacing, such as the critical dimension. In some embodiments, a ratio of W over $D_1$ can be in a range between about 1 and about 2.

In some embodiments, each block of patterned upper patterning layer 350 in isolated region 308 can also have width W that is substantially equal to or greater than the critical dimension. In isolated region 308, the blocks of patterned upper patterning layers 350 can be separated by different distances. In some embodiments, the blocks of patterned upper patterning layers 350 can be separated by a substantial equal distance, such as distance $D_2$ that is greater than distance $D_1$. In some embodiments, a ratio of distances $D_2$ over $D_1$ can be between about 1.5 and about 6. In some embodiments, distance $D_2$ can be between about 30 nm and about 200 nm. For example, distance $D_2$ can be between about 30 nm and about 50 nm, between about 50 nm and about 70 nm, between 70 nm and about 100 nm, between 100 nm and about 200 nm, or any suitable dimensions. For example, distance $D_2$ can be about 60 nm. A greater ratio of distances $D_2$ over $D_1$ represents a greater contrast in pattern density across dense region 306 and isolated region 308. In some embodiments, the ratio of distances $D_2$ over $D_1$ can be greater than about 6, such as about 10, about 20, about 30, or any suitable ratio. Thickness t of etch-adjusting layer 230 can be adjusted based various factors. For example, thickness t can be adjusted based on the ratio of distances $D_2$ over $D_1$. In some embodiments, etch-adjusting layer 230 having a greater thickness t can be used in semiconductor devices having a higher ratio of distances $D_2$ over $D_1$. The greater thickness of etch-adjusting layer 230 can provide better etch-adjusting capability in isolated regions 308 by allowing a profile tuning process, such as an etching process to continue for a greater amount of time as needed. In some embodiments, isolated region 308 can include a hybrid configuration where a group of blocks are separated by the critical dimension and another group of blocks are separated by a distance greater than the critical dimension. In some embodiments, a ratio of W over $D_2$ can be in a range between about 0.1 and about 0.2. The ranges of width W and distances $D_1$ and $D_2$ described herein are examples and can vary based on design.

Figure 4:
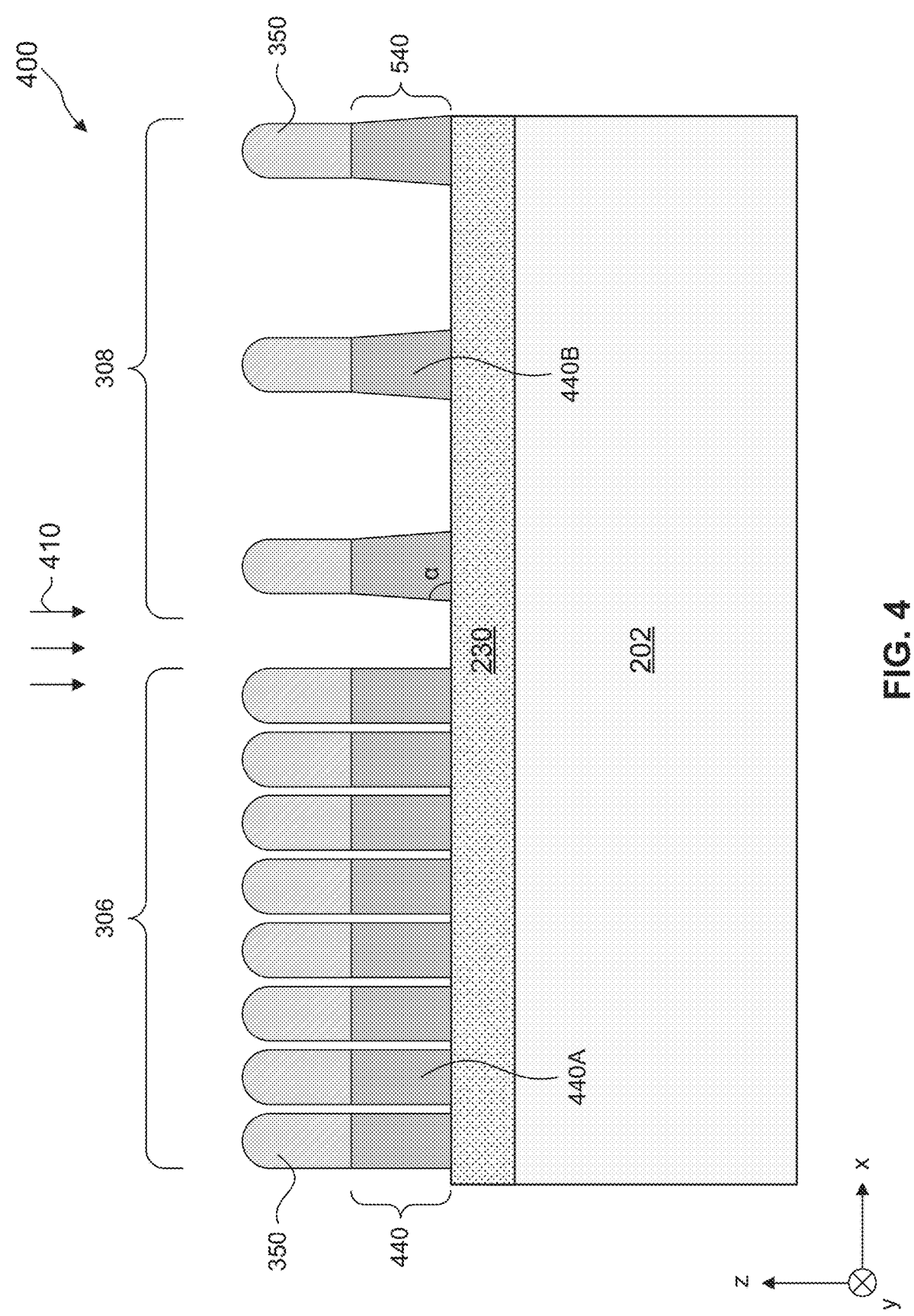

Referring to FIG. 7, in operation 706, a second etching process is performed on the lower patterning layer to form a patterned lower patterning layer, according to some embodiments. FIG. 4 is a cross-sectional view of semiconductor structure 400, after a patterned lower patterning layer 440 is formed. Patterned lower patterning layer 440 is formed by patterning lower patterning layer 240 described above in FIG. 2.

Using the blocks in patterned upper patterning layer 350 as a masking layer, a second etching process 410 can selectively remove portions of lower patterning layer 240 without etching patterned upper patterning layer 350. Second etching process 410 can continue until underlying etch-adjusting layer 230 is exposed between blocks of patterned lower patterning layer 440. In some embodiments, second etching process 410 can be a plasma etching process that has high etch selectivity of lower patterning layer 240 over patterned upper patterning layer 350. For example, second etching process 410 can be a plasma etching process with substrate bias to increase etching rate in the vertical direction (e.g., z direction). Due to the difference of precursor movement in dense region 306 and isolated region 308, the removal rate of lower patterning layer 240 in those regions can vary. As a result, etching profiles of patterned lower patterning layer 440 in dense region 306 can be different from etching profiles in isolated region 308. For example, as shown in FIG. 4, sidewalls of blocks 440A in dense region 306 can have a sidewall that is substantially perpendicular to a top surface of etch-adjusting layer 230. In contrast, sidewalls of blocks 440B in isolated region 308 can have a sidewall that is at an angle α that is less than about 90° with respect to the top surface of etch-adjusting layer 230. In some embodiments, angle α can be greater than about 75° and less than about 90°. Thus, blocks 440B in isolated region 308 can have a trapezoidal cross-sectional profile.

Referring to FIG. 7, in operation 708, a third etching process is performed on the lower patterning layer to fine tune the cross-sectional profile of the patterned lower patterning layer until the cross-sectional profile of each block of the patterned lower patterning layer are substantially the same, according to some embodiments. FIG. 5 is a cross-sectional view of semiconductor structure 500 that includes substantially the same etching profile of blocks across isolated region 308 and dense region 306.

As shown in FIG. 5, a third etching process 510 is performed on semiconductor structure 500. Third etching process can be a substantially lateral etch (e.g., in the x direction). Etch-adjusting layer 230 can allow the third etching process 510 to selectively tune the etch profiles of blocks in isolated region 308 without etching vertically into substrate 202. The horizontal etching rate of third etching process 510 can be substantially greater than its vertical etching rate. For example, horizontal etching rate in isolated region 308 can be about 10 times to about 50 times of the vertical etch rate in isolated region 308. Third etching process 510 can be configured such that horizontal etching progress 510H in isolated region 308 can be substantially greater than any horizontal etching progress occurring in dense region 306. The greater horizontal etching rate in isolated region 308 can be achieved through various methods. For example, third etching process 510 can be a plasma etching process where precursors have a greater probability to enter wider opening than a narrower opening. In some embodiments, third etching process 510 can be a plasma etching process without the application of substrate voltage bias to promote lateral etching (e.g., in the x direction). In some embodiments, third etching process 510 can use fluorocarbon-based precursors having variations of the chemical composition of $C_xH_yF_z$. For example, third etching process 510 can use precursors, such as fluoroform ($CHF_3$), fluoromethane ($CH_3F$), ethylacetylene ($C_4H_6$), tetrafluoromethane (CF$_4$), any suitable precursor, and/or combinations thereof. In some embodiments, third etching process 510 can also use chlorine-based precursors, such as chlorine. In some embodiments, third etching process 510 can use bromine-based precursors, such as hydrogen bromide (HBr). In some embodiments, third etching process 510 can use additives to assist the selective tuning process. For example, third etching process 510 can use additives such as hydrogen (H$_2$), oxygen (O$_2$), carbon dioxide (CO$_2$), silicon tetrachloride (SiCl$_4$), any suitable additive, and/or combinations thereof. In some embodiments, third etching process 510 can also use any suitable inert gas to assist in profile tuning. For example, inert gas can assist by lowering precursor concentration or increase ion bombardment. In some embodiments, third etching process 510 can use inert gas, such as helium (He), argon (Ar), any suitable inert gas, and/or combinations thereof.

Etch-adjusting layer 230 can protect underlying substrate 202 during the profile tuning process. Etch-adjusting layer 230 can be formed using a material that is substantially inert with respect to the first, second, and third etching processes. Depending on the materials used to form lower and upper patterning layers 240 and 250, etch-adjusting layer 230 can be formed using a different material to achieve the etching selectivity. For example, lower and upper patterning layers 240 and 250 can be formed of silicon nitride and silicon oxide, respectively, while etch-adjusting layer 230 can be formed using hafnium oxide. The thickness of etch-adjusting layer 230 can be between about 3 nm and about 5 nm. Increasing the thickness of etch-adjusting layer 230 can provide greater protection for underlying layers. Decreasing the thickness of etch-adjusting layer 230 can provide shorter etching time when portions of etch-adjusting layer 230 is removed in subsequent etching processes.

Third etching process 510 can continue until blocks 440B of patterned lower patterning layer 440 described above in FIG. 4 achieve substantially the same cross-sectional profile of blocks 440A. In some embodiments, the physical dimensions of blocks 440A in dense region 306 remain substantially the same during third etching process 510. As shown in FIG. 5, blocks 404A in dense region 306 have sidewalls that are substantially perpendicular to a top surface of etch-adjusting layer 230. Third etching process 510 can continue until blocks in isolated region 308 also have sidewalls that are substantially perpendicular to the top surface of etch-adjusting layer 230. Thus, cross-sectional profiles of patterned lower patterning layer 440 in isolated region 308 can be tuned to form tuned patterned lower patterning layer 540. For example, an angle β between a sidewall of block 540B of tuned patterned lower patterning layer 540 in isolated region 308 and the top surface of etch-adjusting layer 230 can be about 90°.

Referring to FIG. 7, in operation 710, a fourth etching process is performed to etch the etch-adjusting layer and the substrate to form fin structures, according to some embodiments. FIG. 6 is a cross-sectional view of semiconductor structure 600 after fin structures are formed. A fourth etching process 610 can be performed on semiconductor structure 600 using patterned upper patterning layer 350 and tuned patterned lower patterning layers 540 as masking layers. In some embodiments, the physical dimensions of blocks 440A in dense region 306 remain substantially the same during fourth etching process 610. Fourth etching process 610 can include a first operation of etching away etch-adjusting layer 230 exposed between blocks of patterned upper and lower patterning layers 350 and 540 and a second operation that etches into substrate 202 to form fin structures 604. Fourth etching process 610 can continue until a nominal height of fin structures 604 is achieved. As the block profile of patterned lower patterning layer 540 is adjusted to have substantially the same cross-sectional profile, each fin of fin structures 604 can have substantially the same width. Therefore, as dimensions of semiconductor devices continue to shrink, the method disclosed herein can form fin structures having substantially the same width in both dense region 306 and isolated region 308. In some embodiments, patterned upper patterning layer 350 and tuned patterned lower patterning layer 540 are removed after fin structures 604 are formed. In some embodiments, etch-adjusting layer 230 can remain on fin structures 604. Semiconductor structures such as gate electrodes, gate dielectric layers, source/drain structures, contact structures, and any suitable semiconductor structures illustrated in FIG. 1 can be formed on fin structures 604 and are not described in detail herein for simplicity.

Various embodiments in accordance with this disclosure provide methods of forming fin structures having uniform lateral dimensions in areas of different pattern density. Fin structures can be formed by forming one or more patterned patterning layers on a substrate followed by a plasma etching process. An etch-adjusting layer can be deposited between the substrate and the one or more patterned patterning layers. The one or more patterned patterning layers can include one or more hard mask layers. During one or more stages of the plasma etching process, the etch-adjusting layer can retard downward etching progress and enhance lateral etching progress to achieve substantially the same etching profiles in isolated regions (e.g., regions with lower pattern density) and dense regions (e.g., regions with higher pattern density).

In some embodiments, a method includes forming a semiconductor structure with a substrate, a dielectric layer, a lower patterning layer, and an upper patterning layer. The dielectric layer is disposed on the substrate, the lower block layer is disposed on the dielectric layer, and the upper blocking is disposed on the lower patterning layer. The method also includes performing a first etching process on the upper patterning layer to form a patterned upper patterning layer. The patterned upper patterning layer includes a first region with a first pattern density and a second region with a second pattern density that is lower than the first pattern density. The method further includes performing a second etching process on the lower patterning layer to form a patterned lower patterning layer. The patterned lower patterning layer includes a first plurality of blocks in the first region and a second plurality of blocks in the second region. The method also includes performing a third etching process on the first and second pluralities of blocks at first and second etching rates respectively to form a tuned patterned lower patterning layer. The first etching rate is lower than the second etching rate. The method also includes performing a fourth etching process on the dielectric layer using the patterned upper patterning layer and the tuned patterned lower patterning layer as masks.

In some embodiments, a method for forming a semiconductor structure includes depositing a dielectric layer on a substrate and depositing a patterning layer on the dielectric layer. The method also includes performing a first etching process on the patterning layer to form a first region including a first plurality of blocks at a first pattern density and a second region including a second plurality of blocks at a second pattern density that is lower than the first pattern density. The method also includes performing a second etching process on the second plurality of blocks to decrease a width of each block of the second plurality of blocks and etching the dielectric layer and the substrate using the first and second pluralities of blocks to form a plurality of fin structures.

In some embodiments, a semiconductor structure includes a substrate and a plurality of fin structures formed on the substrate. The plurality of fin structures include a first plurality of fin structures at a first pattern density. A first width of each fin structure of the first plurality of fin structures substantially equals to a critical dimension of a lithography apparatus. A first separation between adjacent fin structures of the first plurality of fin structures is between about 20 nm and about 70 nm. A second plurality of fin structures at a second pattern density that is lower than the first pattern density. A second width of each fin structure of the second plurality of fin structures substantially equals to the first width. A second separation between adjacent fin structures of the first plurality of fin structures is between about 10 nm and about 20 nm. A dielectric layer formed on the first and second pluralities of fin structures.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
    forming a semiconductor structure with a substrate, a dielectric layer, a lower patterning layer, and an upper patterning layer, wherein the dielectric layer is disposed on the substrate, the lower patterning layer is disposed on the dielectric layer, and the upper patterning layer is disposed on the lower patterning layer;
    performing a first etching process on the upper patterning layer to form a patterned upper patterning layer;
    performing a second etching process on the lower patterning layer to form a patterned lower patterning layer, wherein the patterned lower patterning layer comprises a first plurality of blocks, and wherein each block of the first plurality of blocks comprises a trapezoidal cross-sectional profile;
    performing a third etching process on the first plurality of blocks to form a second plurality of blocks; and
    performing a fourth etching process on the substrate and the dielectric layer to form a plurality of fins using the patterned upper patterning layer and the second plurality of blocks as masks.

2. The method of claim 1, wherein forming the lower patterning layer comprises depositing a dielectric material.

3. The method of claim 1, wherein forming the upper patterning layer comprises depositing a photoresist material.

4. The method of claim 1, further comprising etching the substrate using the patterned upper patterning layer and the second plurality of blocks as masks to form a plurality of fin structures.

5. The method of claim 1, wherein performing the third etching process comprises etching the first plurality of blocks in a lateral direction.

6. The method of claim 1, wherein performing the second etching process comprises applying a substrate voltage bias to the substrate.

7. The method of claim 1, wherein performing the second etching process comprises forming a sidewall of a block of the first plurality of blocks that is at an angle less than about 90° with respect to a top surface of the dielectric layer.

8. The method of claim 7, wherein performing the third etching process comprises etching the sidewall of the block of the first plurality of blocks such that a sidewall of a block of the second plurality of blocks is substantially perpendicular to the top surface of the dielectric layer.

9. The method of claim 1, wherein the first plurality of blocks are inert to the third and fourth etching processes.

10. The method of claim 1, wherein performing the third etching process comprises performing a plasma etching process without applying a substrate voltage bias.

11. A method for forming a semiconductor structure, comprising:
    depositing a dielectric layer on a substrate;
    depositing a patterning layer on the dielectric layer;
    performing a first etching process on the patterning layer to form a first plurality of blocks, wherein portions of the dielectric layer are exposed between adjacent blocks of the first plurality of blocks;
    performing a second etching process on the portions of the dielectric layer to form a second plurality of blocks under the first plurality of blocks;
    performing a third etching process on the second plurality of blocks to decrease a width of each block of the second plurality of blocks; and
    etching the substrate using the first and second pluralities of blocks to form a plurality of fin structures.

12. The method of claim 11, wherein performing the third etching process continues until a width of each block of the second plurality of blocks substantially equals to a width of each block of the first plurality of blocks.

13. The method of claim 11, wherein performing the second etching process comprises applying a substrate voltage bias to the substrate and performing a plasma etching process.

14. The method of claim 11, wherein performing the third etching process comprises performing a plasma etching process without applying a substrate voltage bias.

15. The method of claim 11, wherein the first plurality of blocks are inert to the second etching process and the third etching process.

16. A method, comprising:
    disposing a lower patterning layer on a dielectric layer;
    disposing an upper patterning layer on the lower patterning layer;
    performing a first etching process on the upper patterning layer to form a patterned upper patterning layer, wherein the patterned upper patterning layer comprises a first region with a first pattern density and a second region with a second pattern density that is lower than the first pattern density;
    performing a second etching process on the lower patterning layer to form a patterned lower patterning layer, wherein the patterned lower patterning layer comprises a first plurality of blocks in the first region and a second plurality of blocks in the second region, wherein performing the second etching process comprises applying a substrate voltage bias to the dielectric layer and performing a first plasma etching process; and performing a third etching process on the first and second pluralities of blocks at respective first and second etching rates, wherein the first etching rate is lower than the second etching rate, and wherein performing the third etching process comprises performing a second plasma etching process without the substrate voltage bias.

17. The method of claim 16, further comprising performing a fourth etching process on the dielectric layer to form a plurality of fins using the first and second pluralities of blocks as masks.

18. The method of claim 16, wherein performing the third etching process comprises performing a substantially lateral etching process.

19. The method of claim 16, wherein performing the third etching process comprises continuing the third etching process until a width of each block of the second plurality of blocks substantially equals to a width of each block of the first plurality of blocks.

20. The method of claim 16, wherein performing the third etching process comprises continuing the third etching process until a sidewall of each block of the second plurality of blocks is substantially perpendicular to a top surface of the dielectric layer.

* * * * *